United States Patent [19]

Hilgarth et al.

[11] Patent Number: 5,320,685
[45] Date of Patent: Jun. 14, 1994

[54] THIN SOLAR CELL

[75] Inventors: Just Hilgarth, Ilsfeld; Volker Frese; Matthias Braun, both of Heilbronn, all of Fed. Rep. of Germany

[73] Assignee: Telefunken Systemtechnik AG, Ulm, Fed. Rep. of Germany

[21] Appl. No.: 928,323

[22] Filed: Aug. 12, 1992

[30] Foreign Application Priority Data

Oct. 4, 1991 [DE] Fed. Rep. of Germany ....... 4132903

[51] Int. Cl.$^5$ ................. H01L 31/048; H01L 31/18; H01L 31/05
[52] U.S. Cl. .................................. 136/259; 136/244; 136/251; 136/255; 136/256; 136/262; 437/2; 437/5
[58] Field of Search ............... 136/244, 255, 256, 262, 136/259, 251; 437/2-5

[56] References Cited

U.S. PATENT DOCUMENTS

| | | | |
|---|---|---|---|
| 3,378,407 | 4/1968 | Keys | 136/244 |
| 3,527,619 | 9/1970 | Miley | 136/244 |
| 4,673,770 | 6/1987 | Mandelkorn | 136/259 |
| 4,692,559 | 9/1987 | Ellion et al. | 136/262 |
| 4,746,618 | 5/1988 | Nath et al. | 437/2 |
| 5,021,099 | 6/1991 | Kim et al. | 136/249 TJ |

FOREIGN PATENT DOCUMENTS

| | | | |
|---|---|---|---|
| 0232749 | 8/1987 | European Pat. Off. | 136/244 |
| 3900254 | 8/1989 | Fed. Rep. of Germany | 136/255 |
| 61-105876 | 5/1986 | Japan | 136/244 |

OTHER PUBLICATIONS

McClelland et al., *A Technique For Producing Epitaxial Films On Reuseable Substrates*, Appl. Phys. Lett., 37(6), Sep. 1980, pp. 560-562.

Primary Examiner—Aaron Weisstuch
Attorney, Agent, or Firm—Spencer, Frank & Schneider

[57] ABSTRACT

A method and apparatus for forming a thin solar cell having a substantially planar body comprising a first layer which includes at least one photoactive semiconductor layer. This first layer has a frontal light entrance face, a rear face, and side edge face. A second layer comprising an electrically conductive grid-shaped front contact and an anti-reflection layer is located on the frontal light entrance face. A third layer comprising a front cover glass is fastened substantially adjacent the anti-reflection layer and the front grid-shaped contact. A fourth layer, comprising an electrically conductive rear conductive contact, is located on the rear face of the first layer. Spaced apart from the first layer are two electrically interconnection pads. Each pad has a face suitable for an electrical interconnection. A first connection for electrically connecting one pad to the front grid shaped contact and a second connection for electrically connecting the other pad to the rear conductive contact are disposed on one side of the solar cell.

22 Claims, 4 Drawing Sheets

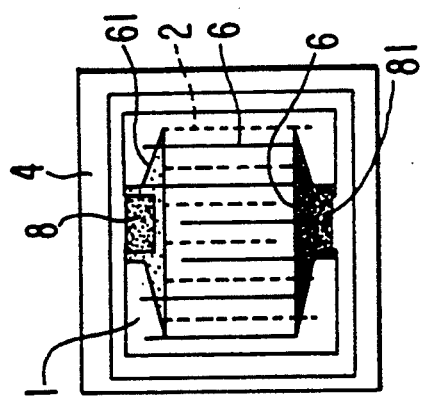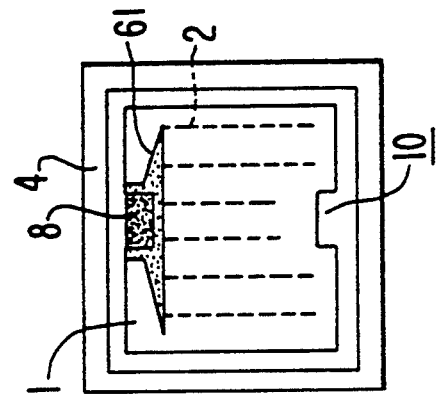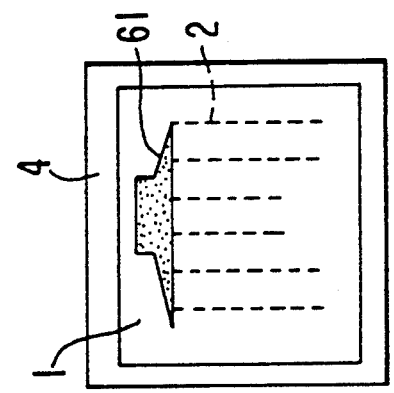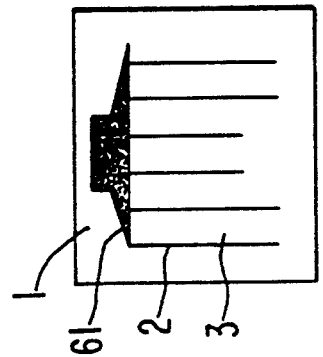

THIN SOLAR CELL

BACKGROUND OF THE INVENTION

1. Field of the Invention

The present invention relates to a thin solar cell and to a method for producing the same and, more particularly, to a thin solar cell of the type having a body composed essentially of one or more photoactive semiconductor layers, such as gallium arsenide, with the semiconductor body having on its frontal light entrance face a grid-shaped contact, an anti-reflection layer and a cover glass, and on its rear face a rear contact.

2. Description of the Related Art

High efficiency thin solar cells are presently a target of development all over the world since the ratio of performance to weight is important for use in satellites. Some solar cells are composed of a direct bandgap semiconductor material, such as gallium arsenide, which responds to the absorption of light within a depth of a few μm. Direct bandgap semiconductors of a few μm in thickness are thus able to electrically provide the full function of a solar cell. Other solar cells are composed of an indirect bandgap semiconductor material, such as silicon, which requires a layer of about 70 μm for complete absorption of light. Solar cells made of GaAs exhibit greater efficiencies and better radiation resistance. The use of GaAs solar cells is therefore more advantageous for use with low-orbit satellites. One drawback, however, in using GaAs over Si in solar cells is that for the same thickness of the solar cell, the GaAs cell has a substantially greater weight than the Si cell.

In a GaAs solar cell and in solar cells composed of semiconductors of the III-V or II-VI groups of the Periodic Table of Elements, all of the photoelectrically sensitive layers are produced in an epitaxy process (growing of several differently doped and composed crystalline layers on a carrier substrate). The substrate on which the photoactive layers are produced, inter alia, has no photoelectric function and usually serves only for the production of these layers and to impart stability to the semiconductor body. It is possible to remove layers, that usually are unnecessary for the photoelectric function and undesirable because of their added weight (particularly if used in satellites), partially or in their entirety before the solar cells are put into operation. In this connection, GaAs and other compound semiconductors in which the photoelectric layers are produced in an epitaxial process, offer particular possibilities for separating the substrate layer from the epitaxy in order to produce thin semiconductor layers. A few of the separation methods include:

(1) the CLEFT process for epitaxial layers; the CLEFT process is described in *Appl. Phys. Lett.* 37(6), Sep. 15, 1980, pages 560-562;

(2) the lift-off technique by use of a chemically selectively-etchable epitaxially grown intermediate layer;

(3) an etching technique in which the substrate is etched away down to an epitaxially grown stop layer;

(4) polishing and/or lapping and/or chemically etching away the substrate down to the photoactive semiconductor layers can also be effected for layers that were not produced by epitaxial processes.

However, the complete or partial removal of the substrate is not a required part of the present invention. A thin solar cell can also be a cell in which the semiconductor body, comprising one or more photoactive semiconductor layers, due to its low thickness and its concomitant fragility, can no longer be sufficiently manipulated without the presence of a stabilizing carrier. In existing solar cell devices, the attachment of connectors to interconnection pads on the thin semiconductor body by bonding, soldering, or other thermally or mechanically stressful processes in order to interconnect adjoining solar cells is very difficult because of the real danger of breakage involved.

The P/N junctions of most semiconductors and, for direct bandgap semiconductors, usually also the so-called window layer (e.g. AlGaAs for GaAs solar cells) required to reduce the high surface recombination are sensitive to environmental influences. The edges of GaAs solar cells and most other solar cells made of a direct bandgap semiconductor material must therefore be specially protected (passivated), at least as long as they are subjected to these influences. For GaAs solar cells, for example, this is usually done by etching a "mesa" trough around the active surface from the front through the photoactive layer with subsequent passivation by means of a dielectric medium (e.g. an anti-reflection layer) and sawing off the edge. This step includes a solar cell active area definition where the size of the photoelectrically active surface of the solar cell is determined.

SUMMARY OF THE INVENTION

It is an object of the present invention to provide a thin solar cell of the above mentioned type which, in spite of its low thickness and relatively great fragility, permits a proper and reliable interconnection into large-area and light-weight solar cell modules.

It is another object of the present invention to provide a method of making a thin solar cell having electrically conductive connection means suitable for electrically interconnecting a plurality of solar cells in series or in parallel wherein the connection means are separated from the photoactive region of the solar cell.

The above and other objects of the invention are accomplished by the provision of a solar cell having a substantially planar body comprising: a first layer comprising at least one photoactive semiconductor layer, having a frontal light entrance face, a rear face and side end faces; a second layer comprising an electrically conductive grid-shaped front contact and an anti-reflection layer, both located on the frontal light entrance face; a third layer comprising a front cover glass fastened substantially adjacent to the anti-reflection layer and the front contact; a fourth layer comprising an electrically conductive rear contact located on the rear face of the first layer; two electrically conductive interconnection pads each having an electrically conductive body and a face suitable for an electrical interconnection, the pads being disposed on one side of the solar cell spaced from the first layer; a first connection means for electrically connecting one pad face to the front contact; and a second connection means for electrically connecting the other pad face to the rear contact. The interconnection pads may be disposed on the semiconductor layer side of the cover glass, which is the underside of the cover glass, either directly on the cover glass or on a dielectric intermediate layer between the cover glass and the interconnection pads in such a manner that the faces of the interconnection pads are suitable to be interconnected from the semiconductor layer side of the cover glass.

Additionally, the invention is accomplished by provision of a method of producing a solar cell comprising the steps of: producing a photoactive semiconductor layer on a carrier substrate, the photoactive semiconductor layer having a front light entrance face, a rear face and an edge region, the rear face being located on the substrate; applying an anti-reflection layer and an electrically conductive grid-shaped front contact to the front light entrance face of the photoactive semiconductor layer; covering the anti-reflection layer and the front contact with a front cover glass; removing, at least partially, the carrier substrate from the photoactive semiconductor layer; removing a portion of the edge region and at least two partial regions of the at least one photoactive semiconductor layer to expose a portion of the front contact and to form a recess in the rear face of the photoactive semiconductor layer; insulating the rear contact from the side end face of the photoactive semiconductor layer; applying a rear contact to the rear face of the photoactive semiconductor layer having the carrier substrate at least partially removed therefrom, the rear contact extending through the recess formed in the photoactive semiconductor layer across a side end face of the photoactive semiconductor layer to an underside of the front cover glass; forming one electrically conductive interconnection pad on the same side of the solar cell as the front cover glass and spaced from the photoactive semiconductor layer for electrical connection with the front contact and forming another electrically conductive interconnection pad for electrical connection with the rear contact on the same side of the solar cell as the front cover glass and spaced from the photoactive semiconductor layer; and connecting respective solar cell electrical connectors to the electrically conductive interconnection pads.

The invention will be better understood from the following detailed description with reference to an illustrative embodiment thereof shown in the drawings.

BRIEF DESCRIPTION OF THE DRAWINGS

The drawing illustrates an embodiment of the invention in which:

FIG. 1A shows the case where the interconnection pads are disposed in the intermediate layers. FIG. 1B shows the case where the interconnection pads are disposed directly on a cover glass of the frontal face in accordance with the present invention;

FIGS. 2A-2D depict four views of a cell each after a series of individual method steps for producing a solar cell in accordance with the present invention and FIG. 1A. FIG. 2A is a front view and FIGS. 2B-2D are rear views of the solar cell;

DETAILED DESCRIPTION OF THE PREFERRED EMBODIMENTS

Figure 1A:
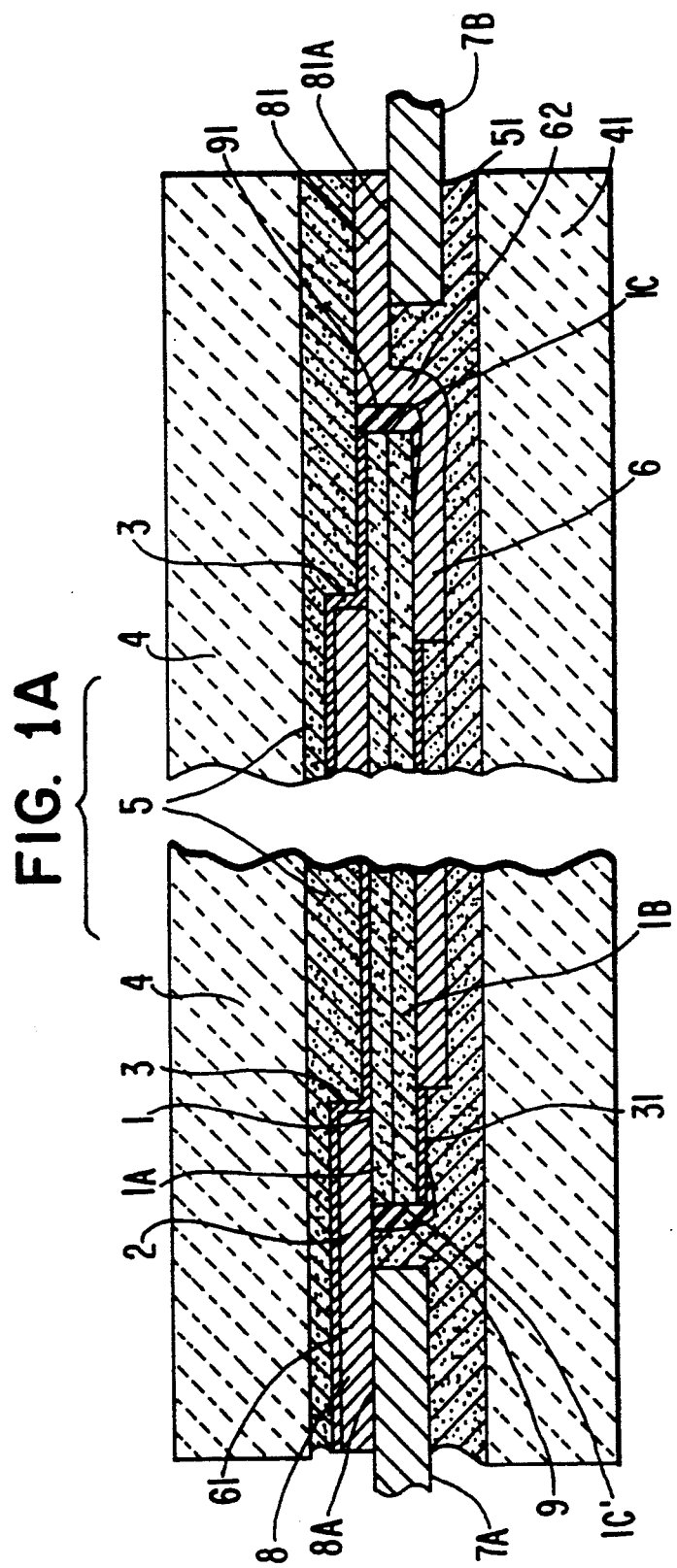
FIGS. 1A and 1B depict a sectional view of a bifacial solar cell, photosensitive on both sides.
Figure 1B:
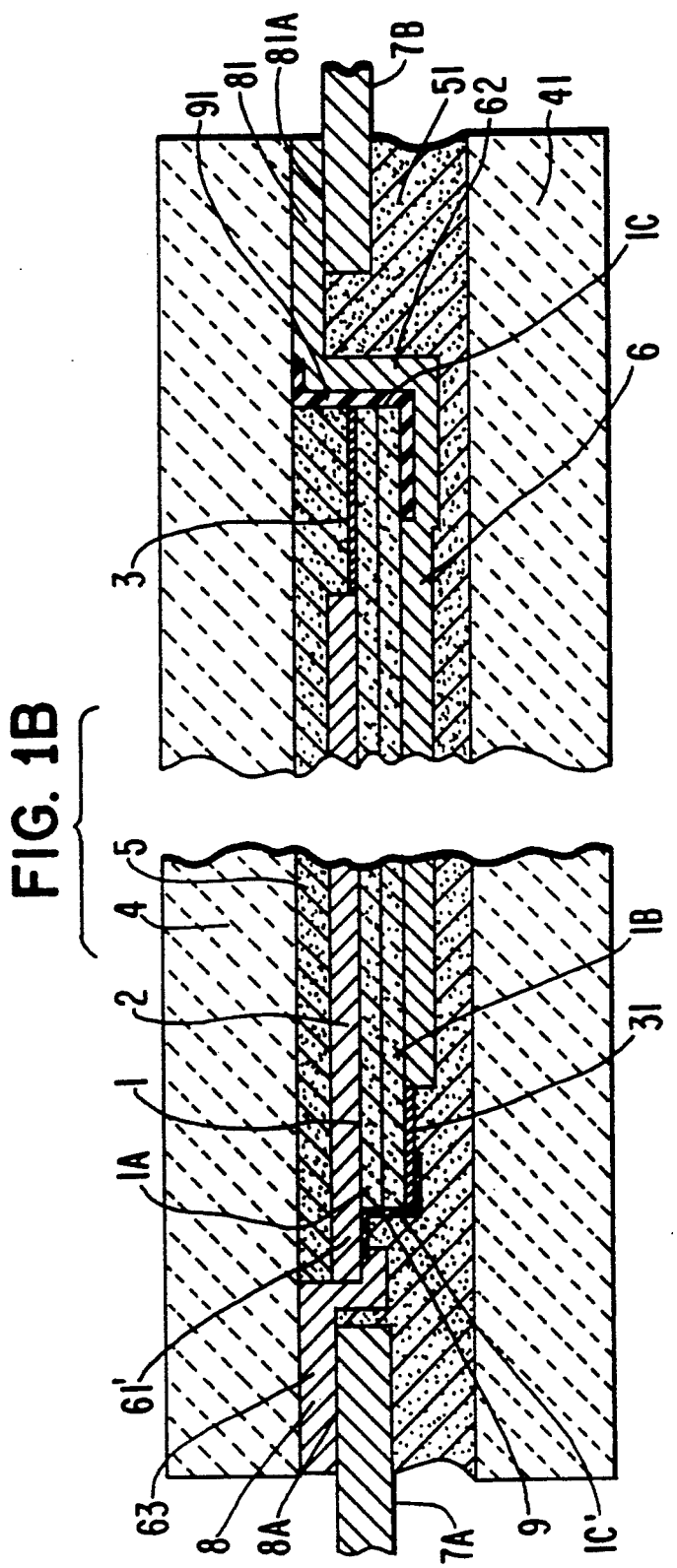

FIGS. 1A and 1B show a thin solar cell including a semiconductor body 1, comprising one or more photoactive semiconductor layers made of a direct bandgap semiconductor material, preferably gallium arsenide.

Semiconductor body 1 is provided on its frontal light entrance face 1A with a front grid-shaped contact 2 and an anti-reflection layer 3 adjacent the semiconductor body 1. A front cover glass 4 is fastened over grid contact 2 and anti-reflection layer 3 by means of a temperature resistant adhesive 5 so as to permit possible sintering of a rear contact 6 to semiconductor body 1. It is alternatively possible to apply cover glass 4 by directly melting onto anti-reflection layer 3 and front grid-shaped contact 2 (direct glassing). These fastening techniques are equally applicable for fastening a rear cover glass 41 on a rear face 1B.

In order to connect solar cell connectors 7A, 7B, which are employed to produce a series and/or parallel connection of several solar cells, an interconnection pad 8 and an interconnection pad 81, each having a respective connection face 8A, 81A are provided for connection to front contact 2 and rear contact 6, respectively, of the solar cell. These interconnection pads 8 and 81 are spaced from semiconductor body 1, are located at the sides of the solar cell for contacting connectors 7A and 7B, respectively, and are disposed, for example, on the adhesive layer 5 (FIG. 1A) or directly (FIG. 1B) on the semiconductor side of the front cover glass 4. Solar cell connector 7A is electrically conductively connected via interconnection pad 8, a front metal bridge 63 in FIG. 1B or contact bar 61 in FIG. 1A, and front contact 2 to frontal light entrance face 1A. Solar cell connector 7B is electrically conductively connected via interconnection pad 81, a metal bridge contact 62 and rear contact 6 to rear face 1B of semiconductor body 1.

It is necessary to provide an insulating layer 91 between a side end face 1C of semiconductor 1 and the metal bridge contact 62. This may advantageously be a dielectric material, e.g. $Si_3N_4$, $ZnO$, or $Al_2O_3$, provided to passivate the side end face 1C of semiconductor body 1. Alternatively, if it should not be necessary to passivate the end face, an insulating bridge of air or an evacuated space may be employed in lieu of a dielectric material. Similarly, a passivating dielectric material 9 is disposed at the opposite side end face 1C' to passivate that end face.

The above-described solar cell constitutes a simple, practical solar cell which has a photosensitive surface on one side. In a further embodiment of the invention, a bifacial solar cell may be created having two oppositely disposed photosensitive sides. However, it is initially necessary to provide a correspondingly suitable epitaxial layer sequence. Moreover, such a solar cell requires, as shown in FIG. 1A, a rear contact 6 in the form of a grid-shaped contact, an anti-reflection layer 31, and a cover glass 41 that is fastened by means of an adhesive layer 51.

The production of the above-described solar cell will now be described with reference to FIGS. 2A to 2D and FIGS. 1A and 1B. Initially, a layer sequence (semiconductor body made of semiconductor material) that can be employed as a solar cell is applied to a carrier substrate together with any intermediate layers required for a later separation process. An electrically conductive grid-shaped front contact 2 with a connecting contact bar 61 and an anti-reflection layer 3 are both applied to the frontal light entrance face 1A of semiconductor body 1 (result is seen in FIG. 2A). The frontal light entrance face 1A of semiconductor body 1 is covered together with grid-shaped contact 2 and anti-reflection layer 3, by a cover glass 4 (result is seen in FIG. 2B).

Then the carrier substrate as well as possibly existing intermediate layers are removed completely or partially from semiconductor body 1 by one of the four methods described in the background portion of this specification. The chosen substrate removal method step is followed by the active area definition, an etching process in which the edges of the semiconductor body 1 and simultaneously a partial region of semiconductor body 1 are etched away in order to expose a region of the front contact 2 as connecting pad 8 (FIG. 1A), or a bar of the front contact 2 to connect to the connecting pad in a later step (FIG. 1B). In the same etching process a recess 10 for the rear connecting pad 81 can be created (results seen in FIG. 2C).

Next, a rear contact 6 is applied to rear face 1B of semiconductor body 1 which has been freed of the carrier substrate and possibly also of intermediate layers. This rear contact extends, for example, into recess 10 and is insulated against the end face of semiconductor body 1 by insulator 91 and extends, via metal bridge contact 62, up to the underside of front cover glass 4 (FIG. 1B) or to adhesive layer 5 disposed between front cover glass 4 and semiconductor body 1 (FIG. 1A). Here, metal bridge contact 62 forms the interconnection pad 81 for rear contact 6 (results seen in FIG. 2D).

During the production of rear contact 6, metal bridge contact 62 and interconnection pad 81 on the underside of cover glass 4, an extension of the front contact bar 61' may also be formed to produce interconnection pad 8 directly on the cover glass (FIG. 1B). Finally, the solar cell connectors 7A and 7B are attached to the interconnection pads 8 and 81, respectively, which are in electrically conductive connection with front contact 2 and with rear contact 6, respectively.

It is advantageous that both interconnection pads 8 and 81 according to the invention are disposed at the underside of the front cover glass 4 at the sides of the solar cell. They may be attached substantially near the edge of the solar cell (i.e., outside, within, or along the edge of the region defined as the active solar cell area), but spaced or remote from the semiconductor body 1. If the interconnection pads are applied to the edge of the solar cell, it is particularly easy to interconnect the solar cells with one another and this is possible almost without any space between the photoactive surfaces of the cells. Interconnection pads 8 for front grid-shaped contacts 2 create no additional loss of active solar cell surface area (compared with a normal solar cell interconnection pad) and the added loss of active solar cell surface area due to the provision of interconnection pads 81 for rear contacts 6 is low and, by suitable design, can be held to below 2% of the total surface area. The position of the interconnection pads spaced or remote from the semiconductor on the covering glass or on an intermediate layer permits the stable application of the connectors without the danger of damage to the sensitive semiconductor body 1.

Another advantage of the invention is that the etching away of the edges of the side end face 1C and 1C' (solar cell surface area definition step), the opening of front interconnection pad 8 (FIG. 1A) and, for example, the etching away of a location for rear contact 6 to create recess 10 for bridge contact 62 can be performed in a single process step. The damage to the semiconductor edge (underetching, breakouts, etc.) which might possibly occur during a separation process, for example by sawing, is also eliminated by the etching. Since in epitaxial processes, layer growth in a strip of about 1–2 mm at the edge of the substrate does not occur with comparable quality as on the remainder of the semiconductor (epitaxy, for example, will normally produce short circuits in the edge region of a wafer), the substrate should be selected to provide this amount along the edge at the beginning of its production in excess of the anticipated final photoelectrically active surface area of the solar cell. The invention takes advantage of this. If whole epitaxially produced wafers are worked into a single solar cell, this edge strip, which is necessary for the production of high quality solar cells, contributes to safe handling but is not a necessary feature of the present invention. Edges of a few $\mu m$ in width are sufficient.

It is possible that the edges (side end faces 1C and 1C') of the semiconductor body 1 produced by etching may be passivated before the application of rear contact 6, for example by means of photolacquers, polyimides, nitrides, oxides, the rear anti-reflection layer 31 (in a bifacial cell), or, other dielectric materials. This passivation may also serve as insulation 9 for the contact 61.

For the production of a bifacial solar cell, the following additional method steps must be performed:

a photoactive semiconductor layer sequence for use as a bifacial solar cell is applied to the carrier substrate;

an electrically conductive grid-shaped rear contact 6 and an anti-reflection layer 31 are applied to rear face 1B after it has been freed of the carrier substrate and of possibly existing intermediate layers:

a rear cover glass 41 is applied to rear face 1B of solar cell 1.

Figure 4:
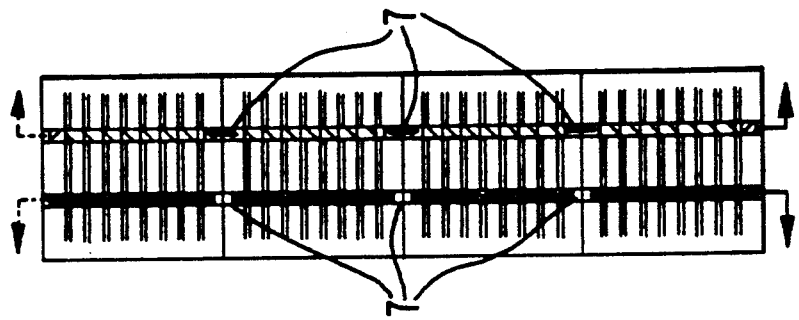
FIG. 4 depicts a parallel connection of four solar cells in accordance with the present invention.
Figure 5:
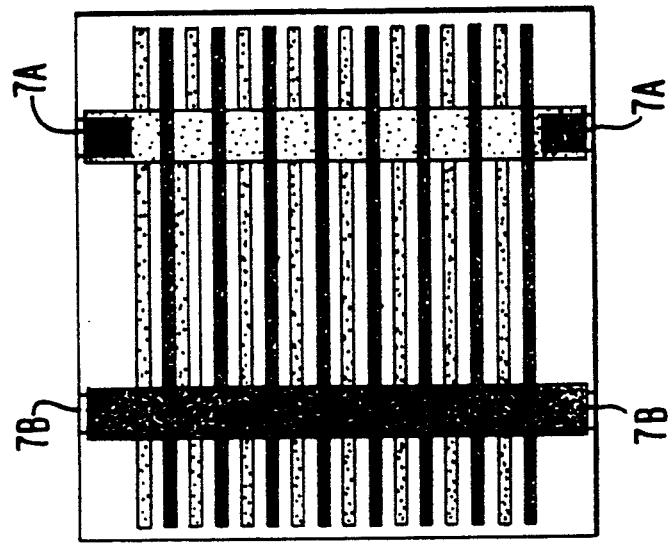
FIG. 5 depicts a solar cell having a grid design for both a serial and a parallel connection in accordance with the present invention.
Figure 3:
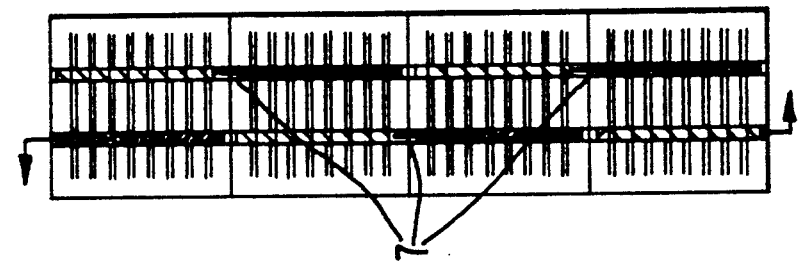
FIG. 3 depicts a serial connection of four solar cells in accordance with the present invention.

Due to the fact that front and rear interconnection pads, 8 and 81 respectively, are disposed on the same side of front cover glass 4, it is both easy and possible without changing the process or the basic grid design to produce a solar cell for serial as well as parallel interconnection so that there is almost no loss of active surface area due to the interconnection of these cells and almost no space is left between the active surfaces. Appropriate examples can be found in FIGS. 3 to 5, wherein FIG. 5 illustrates a rear view of a grid design for serial and parallel interconnection, FIG. 3 illustrates the rear view of the grid design of FIG. 5 as serial interconnection, and FIG. 4 illustrates the rear view of this grid design for parallel interconnection.

While there have been described what are presently believed to be the preferred embodiments of the invention, it will be readily apparent to one skilled in the art that numerous changes can be made in the structure, ingredients, proportions and condition set forth in the foregoing embodiments without departing from he invention as described herein and as defined in the appended claims.

What is claimed is:

1. A solar cell having a substantially planar body comprising:

a first layer comprising at least one photoactive semiconductor layer having a frontal light entrance face, a rear face, and side edge faces;

a second layer comprising an electrically conductive grid-shaped front contact and an anti-reflection layer, both located on said frontal light entrance face;

a third layer comprising a front cover glass fastened substantially adjacent to said anti-reflection layer and said front contact;

a fourth layer comprising an electrically conductive rear contact located on said rear face of said first layer;

first and second electrically conductive interconnection pads each having an electrically conductive body and a connection face suitable for an electrical interconnection, said interconnection pads both being disposed on one side of the solar cell and spaced apart from said first layer;

a first connection means for electrically connecting the connection face of the first interconnection pad to said front contact;

a second connection means for electrically connecting the connection face of the second interconnection pad to said rear contact.

2. A solar cell as defined in claim 1, wherein the at least one photoactive semiconductor layer comprises gallium arsenide.

3. A solar cell as defined in claim 1, wherein said first and second interconnection pads are disposed on a side of the front cover glass facing the semiconductor layer such that the connection faces of the interconnection pads are connected to the front and rear contacts.

4. A solar cell as defined in claim 1, further comprising a dielectric intermediate layer disposed between said third and fourth layers wherein the interconnection pads are disposed in the dielectric intermediate layer and the connection faces of said interconnection pads are connected to the front and rear contacts.

5. A solar cell as defined in claim 4, wherein said dielectric intermediate layer comprises an adhesive layer.

6. A solar cell as defined in claim 4, wherein said dielectric intermediate layer comprises an anti-reflection layer.

7. A solar cell as defined in claim 1, wherein said solar cell has a photoactive surface area and said interconnection pads are disposed near an edge region of said photoactive surface area.

8. A solar cell as defined in claim 1, wherein said first and second electrical connection means comprise a first and a second conductive bridge contact, respectively.

9. A solar cell as defined in claim 8, further comprising an insulating layer between said first layer and said second conductive bridge contact.

10. A solar cell as defined in claim 9, wherein said insulating layer comprises one of air and an evacuated space.

11. A solar cell as defined in claim 1, wherein side edge faces of said at least one photoactive semiconductor layer are passivated by a dielectric material.

12. A solar cell as defined in claim 1, wherein said first layer comprises a sequence of photoactive semiconductor layers, and is light sensitive on said frontal light entrance face and on said rear face, said rear contact of said fourth layer comprises an electrically conductive grid-shaped contact; said fourth layer further comprises an anti-reflection layer; and said solar cell further comprises a fifth layer comprising a rear cover glass fastened substantially adjacent to said fourth layer.

13. A method of producing a solar cell, comprising the steps of:
(a) producing a photoactive semiconductor layer on a carrier substrate, the photoactive semiconductor layer having a front light entrance face, a rear face and an edge region, said rear face being disposed on the substrate;

(b) applying an anti-reflection layer and an electrically conductive grid-shaped front contact to the front light entrance face of the photoactive semiconductor layer;

(c) covering the anti-reflection layer and the grid-shaped contact with a front cover glass;

(d) removing at least partially the carrier substrate from the photoactive semiconductor layer;

(e) removing a portion of the edge region, a first partial region of the photoactive semiconductor layer to create a first recess which exposes a portion of the front contact used to form a first electrically conductive interconnection pad disposed on the same side of the solar cell as the front cover glass and spaced from the photoactive semiconductor layer, and a second partial region of the photoactive semiconductor to form a second recess;

(f) insulating the edge region of the photoactive semiconductor layer where the second partial region was removed to form an insulated edge region;

(g) applying a rear contact to the rear face of the photoactive semiconductor layer having the carrier substrate at least partially removed therefrom, the rear contact extending through the second recess in the photoactive semiconductor layer over the insulated edge region of the photoactive semiconductor layer to the side of the front cover glass facing the semiconductor layer to form a second electrically conductive interconnection pad disposed on the same side of the solar cell as the front cover glass and spaced from the photoactive semiconductor layer; and (h) connecting respective solar cell electrical connectors to the electrically conductive interconnection pads.

14. A method as defined in claim 13, further comprising forming a dielectric intermediate layer disposed between the front cover glass and the photoactive semiconductor layer.

15. A method as defined in claim 13, including passivating the side end face of the photoactive semiconductor layer.

16. A method as defined in claim 13, wherein said step (d) includes removing the carrier substrate and any existing epitaxial or intermediate layers from the photoactive semiconductor layer by a CLEFT process.

17. A method as defined in claim 13, wherein said step (d) includes removing the carrier substrate and any existing epitaxial or intermediate layers from the photoactive semiconductor layer by a lift-off process employing a chemically selectively-etchable epitaxially grown intermediate layer.

18. A method as defined in claim 13, wherein said step (d) comprises etching away the carrier substrate and any existing epitaxial layers or intermediate layers to an epitaxially grown stop layer.

19. A method as defined in claim 13, wherein said step (d) includes at least partially removing the carrier substrate and any existing epitaxial layers or intermediate layers from the photoactive semiconductor layer by one of lapping, polishing, or etching.

20. A method as defined in claim 13, wherein said step (a) includes producing on the carrier an epitaxial layer sequence wherein the front and rear faces are light sensitive; said step (g) includes applying the rear contact in the form of an electrically conductive grid-shaped contact; and said method further includes applying an anti-reflective layer to the rear face and covering the rear face with a rear cover glass.

21. A method as defined in claim 13, wherein said step (c) includes applying the front cover glass by way of a temperature resistant cover glass adhesive.

22. A method as defined in claim 13, wherein said step (c) includes melting the front cover glass directly onto the solar cell.

* * * * *